US009231226B2

(12) United States Patent
Kee et al.

(10) Patent No.: US 9,231,226 B2
(45) Date of Patent: Jan. 5, 2016

(54) TERAHERTZ WAVE MODULATOR BASED ON HOLE-INJECTION AND -TRANSFER

(75) Inventors: Chul-Sik Kee, Gwangju (KR); Joong-Wook Lee, Gwangju (KR); Chul Kang, Gwangju (KR); Kiejin Lee, Gwangju (KR); Hyung Keun Yoo, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 206 days.

(21) Appl. No.: 14/005,401

(22) PCT Filed: Dec. 12, 2011

(86) PCT No.: PCT/KR2011/009551
§ 371 (c)(1),
(2), (4) Date: Sep. 16, 2013

(87) PCT Pub. No.: WO2012/124883
PCT Pub. Date: Sep. 20, 2012

(65) Prior Publication Data
US 2014/0001379 A1    Jan. 2, 2014

(30) Foreign Application Priority Data
Mar. 16, 2011  (KR) .................. 10-2011-0023167

(51) Int. Cl.
*G02F 1/00* (2006.01)
*H01L 51/52* (2006.01)
(Continued)

(52) U.S. Cl.
CPC .............. *H01L 51/52* (2013.01); *G02F 1/0126* (2013.01); *H03C 7/00* (2013.01); *G02F 2203/13* (2013.01); *H01L 51/0053* (2013.01); *H01L 51/0081* (2013.01)

(58) Field of Classification Search
CPC ................................ G02F 1/00; G02F 2203/13
See application file for complete search history.

(56) References Cited

U.S. PATENT DOCUMENTS 6,124,964 A     9/2000  Imanishi et al.
7,826,504 B2 *  11/2010 Chen et al. .................. 372/43.01
(Continued)

FOREIGN PATENT DOCUMENTS

JP          10333192 A    12/1998
JP       2007300022 A    11/2007
(Continued)

OTHER PUBLICATIONS

Yoo et al. "Organic conjugated material-based broadband terahertz wave modulators" Applied Physiscs Letters 99, 061108, 2011.*

(Continued)

*Primary Examiner* — Jordan Schwartz
*Assistant Examiner* — George G King
(74) *Attorney, Agent, or Firm* — Hauptman Ham, LLP

(57) ABSTRACT

The present invention relates to a terahertz wave modulator. The terahertz wave modulator includes: a semiconductor substrate; a terahertz modulation layer including an organic-material layer disposed on the semiconductor substrate; and a first incident wave radiation unit for vertically radiating a first incident wave having a terahertz wave region onto the terahertz modulation layer. The transmitted terahertz wave may be variously modified according to the degree of crystallization of an organic material deposited on the semiconductor substrate and according to the intensity of incident light so as to maximize modulation efficiency using the modified terahertz wave. Thus, a device for modulating wavelength width, amplitude, and phase through waveform deformation in a time region may be provided. Furthermore, by bonding together a plasmons or metamaterials having similar surfaces, a highly functional terahertz wave modulation device may be provided, wherein said device may be widely used for optical purposes.

9 Claims, 8 Drawing Sheets

(51) Int. Cl.
*H03C 7/00* (2006.01)
*G02F 1/01* (2006.01)
*H01L 51/00* (2006.01)

(56) References Cited

U.S. PATENT DOCUMENTS

2008/0047928 A1* 2/2008 Iwata et al. .................... 216/24
2009/0136877 A1* 5/2009 Suganuma ..................... 430/325
2011/0114856 A1* 5/2011 Cooke ........................ 250/492.22

FOREIGN PATENT DOCUMENTS

JP 2009282073 A 12/2009
WO 2010006611 A1 1/2010

OTHER PUBLICATIONS

International Search Report mailed on Jul. 16, 2012 for PCT/KR2011/009551.

\* cited by examiner

TERAHERTZ WAVE MODULATOR BASED ON HOLE-INJECTION AND -TRANSFER

CROSS REFERENCE TO RELATED APPLICATION

This application claims the priority of Korean Patent Application No. 10-2011-0023167, filed on Mar. 16, 2011 in the KIPO (Korean Intellectual Property Office). Further, this application is the National Phase application of International Application No. PCT/KR2011/009551 filed on Dec. 12, 2011 which designates the United States and was published in Korean.

TECHNICAL FIELD

The present invention relates to a terahertz wave modulator, and more particularly, to a terahertz wave modulator capable of performing terahertz wave modulation based on injection and transportation of holes excited by incident light and performing various types of modulations on the basis of intensity of an incident wave and a crystal state of an organic material.

BACKGROUND ART

Attempts to modulate and control amplitude, phase, polarization, and the like, of a transmission wavelength in various electromagnetic wave ranges have been widely performed.

In particular, various methods for using a terahertz wave newly developed in an electromagnetic wave range have been proposed recently. An example of the methods may include a method of using designer surface plasmon resonation generated in a terahertz wave, a method of using metamaterial, a method of controlling amplitude of a terahertz wave based on a method of exciting free electrons in semiconductor, and the like.

However, due to limitation of modulation efficiency and inefficiency of fabrication, a new modulation method has been urgently required.

DISCLOSURE

Technical Problem

The present invention is directed to providing a terahertz wave modulator capable of variously changing a transmitted terahertz wave and maximizing modulation efficiency.

Further, the present invention is directed to providing a terahertz wave switching device capable of modulating transmission of a terahertz wave and uniformly modulating amplitude in a full wavelength range of the terahertz wave.

Technical Solution

According to an aspect of the present invention, there is provided a terahertz wave modulator, including: (a) (i) a semiconductor substrate and (ii) a terahertz modulation layer including an organic-material layer disposed on the semiconductor substrate; and (b) a first incident wave radiation unit radiating a first incident wave including a terahertz wave region to be vertically incident on the terahertz modulation layer.

The organic-material layer may be made of organic materials selected from copper phthalocyanine, anthracene, tetracene, pentacene, 3,4,9,10-perylenetetracarboxylic dianhydride (PTCDA), C60, aluminum-tris-quinolate (Alq3), and rubrene.

At least a part of the organic-material layer may have a β-phase crystalline structure.

The organic-material layer may be deposited by a thermal evaporation method and annealed at 100 to 500° C.

The terahertz modulation layer may further include a transparent layer made of materials selected from quartz, sapphire, and PMMA, which is disposed on the organic-material layer.

The terahertz wave modulator may further include: (c) a second incident wave radiation unit radiating a second incident wave, which is pulsed wave or incident light, at a controlled angle to be incident on the terahertz modulation layer.

The second incident wave may be the pulsed wave.

The organic-material layer may be arranged with a plurality of holes having a predetermined pattern and the hole may penetrate through the organic-material layer.

According to another aspect of the present invention, there is provided a terahertz wave switching device, including: the terahertz modulator and further including a second incident wave radiation control unit determining whether the second incident wave is radiated.

Advantageous Effects

As set forth above, according to the exemplary embodiments of the present invention, the terahertz wave modulator can maximize the modulation efficiency by using the transmitted terahertz wave which is variously modified by the degree of crystallization of the organic material deposited on the semiconductor and the intensity of the incident wave, provide the device for modulating the wavelength width, the amplitude, the phase, and the like, by the waveform deformation in the time domain, and can be implemented as the highly functional terahertz wave modulation device by being coupled with the designer surface plasmon or the metamaterial to be widely used for optical purposes.

BEST MODE

Figure 1:
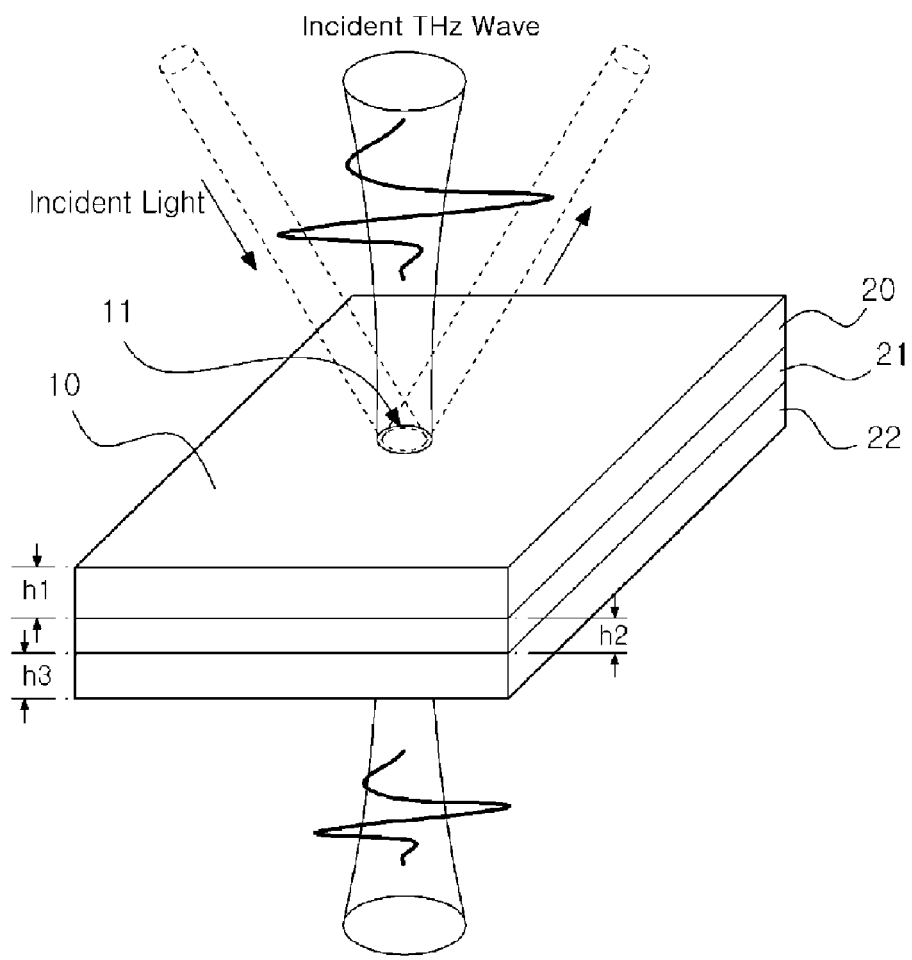
FIG. 1 is a perspective view illustrating a basic structure of a terahertz wave modulator according to an exemplary embodiment of the present invention.

Hereinafter, exemplary embodiments of the present invention will be described in detail with reference to the accompanying drawings. First, it is to be noted that like components or parts are denoted by like reference numerals in the accompanying drawings. In describing the present invention, detailed descriptions related to well-known functions or configurations will be ruled out in order not to unnecessarily obscure the subject matter of the present invention.

A terahertz wave modulator according to an exemplary embodiment of the present invention is configured to include a semiconductor substrate 22, a terahertz modulation layer which includes an organic-material layer 21 on the semiconductor substrate 22, and a first incident wave radiation unit which radiates a first incident wave including a terahertz wave region to be vertically incident on the terahertz modulation layer, in which the terahertz modulation layer further includes a transparent layer 20 made of a material selected from quartz, sapphire, and PMMA which is disposed on the organic-material layer 21 and the transparent layer is a quartz layer made of quartz.

Further, the terahertz modulator according to the exemplary embodiment of the present invention may further include a second incident wave radiation unit radiating a second incident wave, which is a pulsed wave or incident light, to the terahertz modulation layer at a controlled angle.

First, FIG. 1 is a perspective view illustrating a basic structure of a terahertz wave modulator according to an exemplary embodiment of the present invention.

A terahertz wave modulator according to the exemplary embodiment of the present invention is configured to include three independent layers, which are a transparent layer 20 having an upper surface 10, a semiconductor substrate 22 having a lower surface (not illustrated), and an organic-material layer 21 deposited on the semiconductor substrate 22 to be interposed between the transparent layer 20 and the semiconductor substrate 22.

The organic-material layer 21 may include all the organic materials through which free holes excited from semiconductor may be injected through an interface with the organic-material layer, and preferably, may be made of organic materials selected from copper phthalocyanine, anthrancene, tetracene, pentacene, 3,4,9,10-perylenetetracarboxylic dianhydride (PTCDA), C60, aluminum-tris-quinolate (Alq3), and rubrene, more preferably, copper pthalocyanine (CuPc).

The semiconductor substrate includes all the kinds of semiconductors which may excite free electrons by incident light while having excellent transmission characteristics in a terahertz wave region.

An organic material structure on the semiconductor is deposited by a thermal evaporation method and the transparent layer on an intermediate layer is stacked by an adhesive method. The transparent layer serves to prevent the organic material from being oxidized to increase stability of the apparatus.

Basically, a thickness h1, h2, and h3 of each layer is set so that the transparent layer which is an upper layer is 100 μm, the organic-material layer which is an intermediate layer is 200 μm, and the semiconductor which is a lower layer is 500 μm; however, each layer may be fabricated by variously controlling the thickness thereof to optimize a function of the modulator according to the exemplary embodiment of the present invention.

The terahertz wave modulator according to the exemplary embodiment of the present invention is designed so that the first incident wave in the terahertz wave region is vertically incident on an incident point 11 of an upper surface 10 and the second incident wave for exciting free electrons/holes is incident on the incident point 11 of the upper surface 10 at a predetermined incident angle.

Since the second incident wave is in a visible light region and thus is fully reflected by a semiconductor layer, only the transmitted terahertz wave is finally measured on a lower surface which is an opposite surface thereto.

According to the exemplary embodiment of the present invention, when the second incident wave is radiated to the semiconductor of which the surface is deposited with the organic material, the first incident wave in the terahertz region may block 70% or more and the transmission reduction phenomenon of the terahertz wave shows various characteristics according to the degree of crystallization of the organic material, laser power, and characteristics of incident light.

According to the exemplary embodiment of the present invention, the copper phthalocyanine deposited on the semiconductor substrate by the thermal evaporation method shows other crystal characteristic according to the thermal evaporation method and other terahertz wave transmission characteristics are shown according to the crystal characteristics. That is, at least a part of the organic-material layer 21 may have a β-phase crystalline structure.

When it is fabricated at normal temperature, the transmission reduction of the terahertz wave is 20% or less; however, it was confirmed that when the it is fabricated by increasing heat treatment temperature to 150° C. and 250° C., the transmission reduction of the terahertz wave increases to 70% or more.

When the heat treatment temperature increases, the degree of crystallization of the copper phthalocyanine is good and when the sample is fabricated at 150° C., α-phase with good degree of crystallization is shown and when the sample is fabricated at 250° C., β-phase with good degree of crystallization is shown, such that the transmission reduction characteristics of the terahertz wave are shown.

Further, it was confirmed that when the laser power gradually increases, the transmission reduction of the terahertz wave gradually increases. The characteristics have different degrees but were identically shown at all the samples fabricated at various heat treatment temperatures.

Further, it was confirmed that the transmission reduction degree of the terahertz wave is differently shown according to the characteristics of incident light. It is shown that when the transmission characteristic reduction is measured using a continuous wave and a pulsed wave as the incident light, if other conditions are the same, the pulsed wave has efficiency 30% higher than the continuous wave. It is shown at the incident wave of 80 mW that when the sample is fabricated at 250° C., the transmission reduction of the terahertz wave is 55% in case of the continuous wave and the transmission reduction of the terahertz wave is 70% or more.

Figure 2:
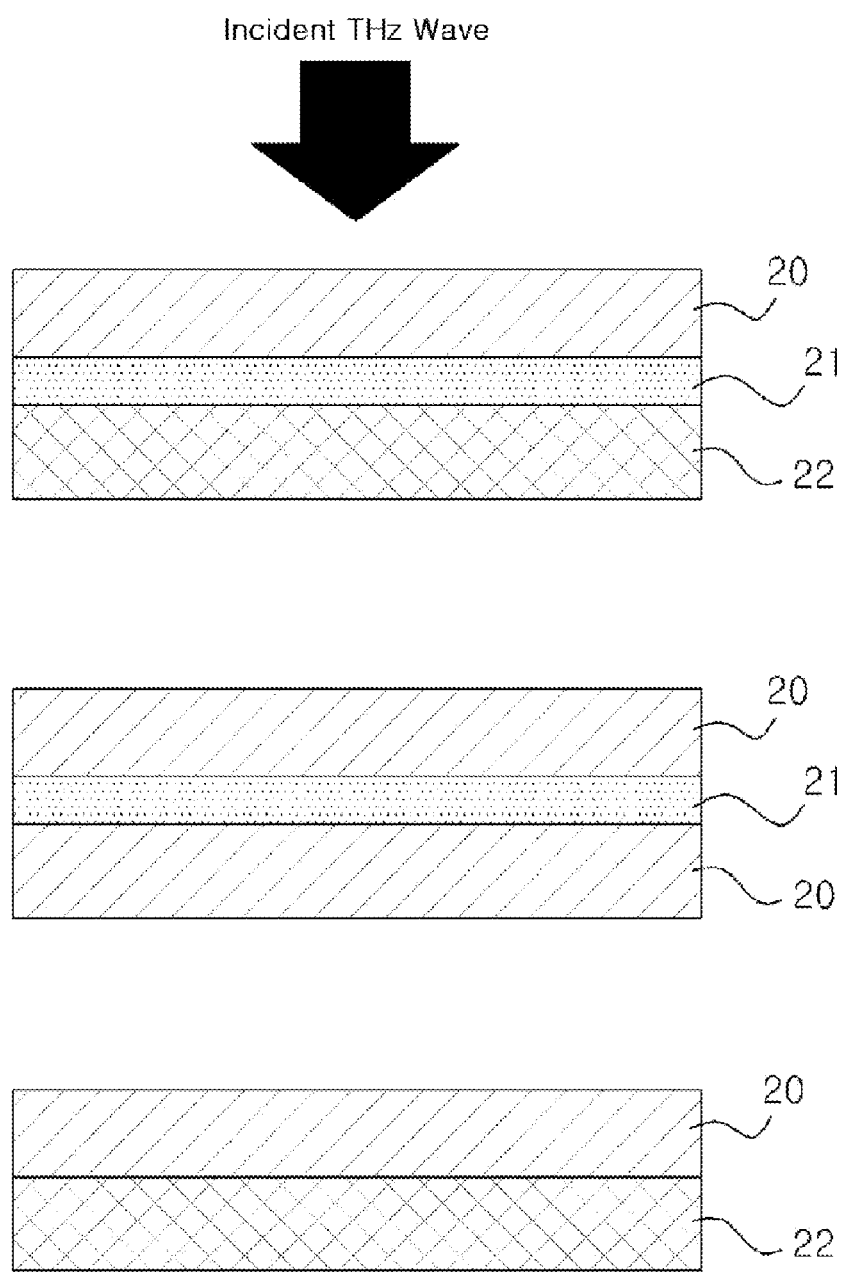
FIG. 2 is a side view of a material structure portion which is a core portion of the terahertz wave modulator according to the exemplary embodiment of the present invention and a structure portion which is differently fabricated for comparing and analyzing efficiency and characteristics of the modulator based on features of the material structure portion.

FIG. 2 is a side view of a material structure portion which is a core portion of the terahertz wave modulator according to the exemplary embodiment of the present invention and a structure portion which is differently fabricated for comparing and analyzing efficiency and characteristics of the modulator based on features of the material structure portion.

The intermediate structure of FIG. 2 is configured to include the transparent layer 20/organic material 21/transparent layer 20. In this case, it was confirmed that the modulation efficiency of the terahertz wave is very low and the lower structure of FIG. 2 is configured to include the transparent layer 20/semiconductor 22. Even in this case, it was that the modulation efficiency is very low.

First, like the intermediate structure of FIG. 2, a quartz transparent layer which may not excite free electrons and holes in a visible light region used as the incident light was used instead of the semiconductor substrate. In this case, when there is incident light and there is no incident light, the transmission of the terahertz wave shows a difference of 1% or less. Even in all the samples fabricated in various heat treatment conditions shows the difference of 1% or less, which shows that the transmission reduction of the terahertz wave is due to free electrons/holes excited on the semiconductor substrate.

Further, in order to measure the contribution of the organic material deposited on the semiconductor substrate, like the following structure of FIG. 2, the measurement was measured only by the semiconductor substrate without the organic-material layer. In this case, it was shown that the difference in transmittance of the terahertz wave is about 3% when the plain light is present and the plain light is not present and the difference in transmittance is about 1% between the samples differently fabricated by the heat treatment condition. To realize the transmission reduction of the terahertz wave, the case shows that the organic material deposited on the semiconductor is necessarily required and is the phenomenon appearing when the free holes excited from a conductor are injected into the copper phthalocyanine.

The coupled structure of the semiconductor/organic material serves to separate the excited free electrons and holes to make the free electrons and holes remain in the excited state for a long period of time so as to form an effective metallic layer to some degree, such that it serves to block the terahertz wave. This is determined by the presence and absence of incident light to implement ultra-speed terahertz wave transmission modulation using the incident light.

Figure 3:
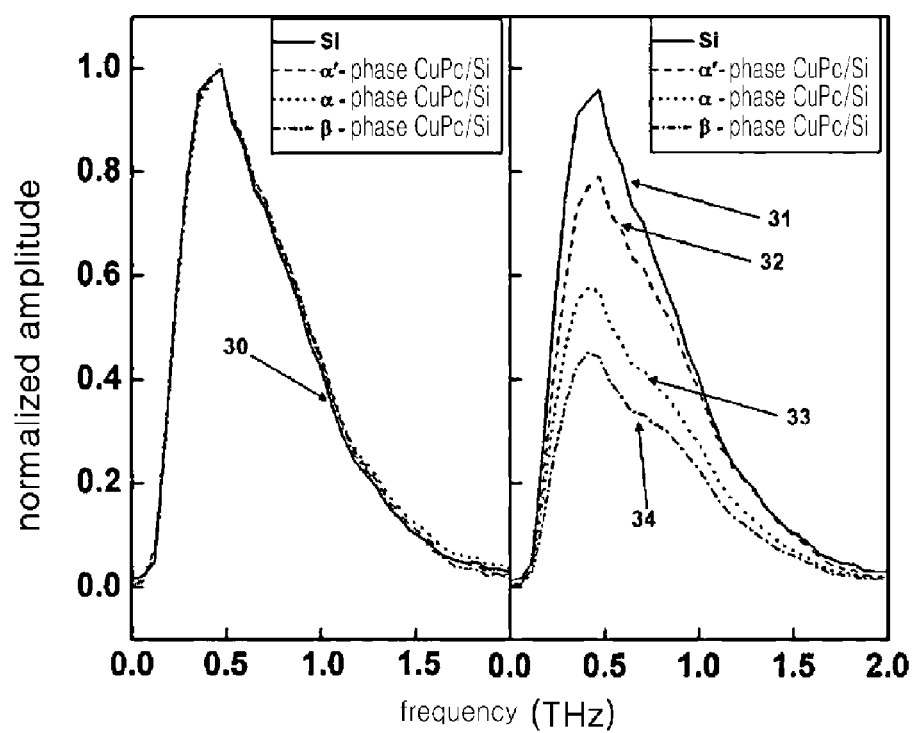
FIG. 3 is a graph illustrating transmission characteristics of a terahertz wave measured by the modulator according to one implementation example of the present invention.

FIG. 3 is a graph illustrating transmission characteristics of the terahertz wave measured by the modulator according to one implementation example of the present invention.

The transmission characteristics of the terahertz wave were measured using the continuous wave as the second incident wave and when incident light is not present, it can be confirmed that the transmission characteristics of the terahertz wave is not modified 30. However, as compared with the case in which the incident light is present but the organic-material layer is not present 31, it is shown that in case of the non-crystalline α-phase, the transmission of the terahertz wave is blocked by about 20% and in case of the crystalline α-phase and the crystalline β-phase, the transmission of the terahertz wave is blocked by about 45% (33) and 55% (34) or more.

That is, as the degree of crystallization is grown well, the characteristics of blocking the terahertz wave are good, such that it may be confirmed that the modulation efficiency of the terahertz wave increases.

Figure 4:
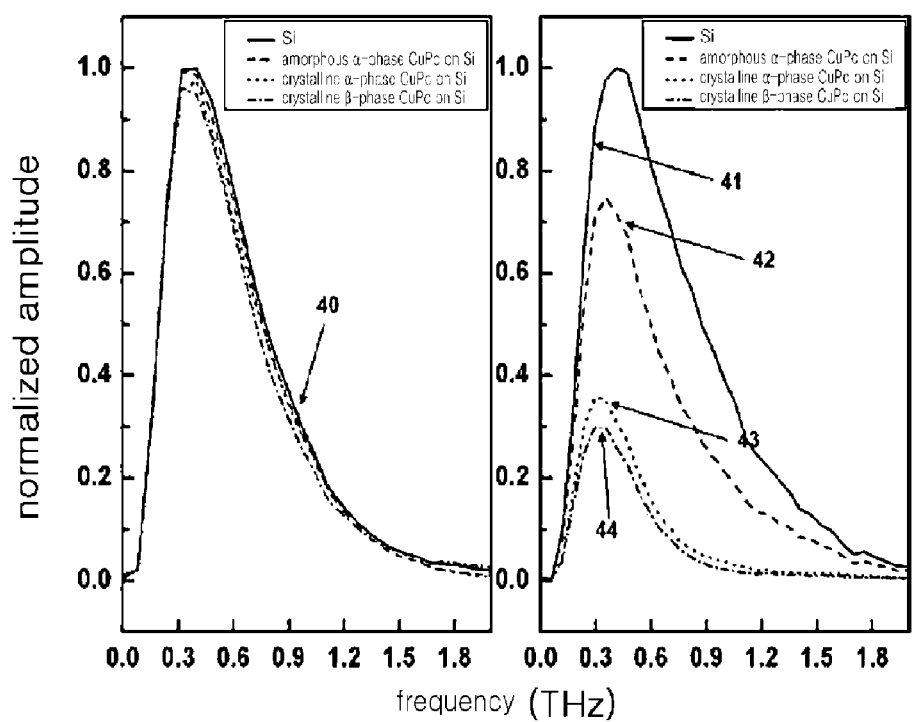
FIG. 4 is a graph illustrating the transmission characteristics of a terahertz wave measured by the modulator according to one implementation example of the present invention.

FIG. 4 is a graph illustrating the transmission characteristics of the terahertz wave measured by the modulator according to one implementation example of the present invention, which is a result measured in the same environment as FIG. 3. Meanwhile, the difference between FIG. 4 and FIG. 3 is that the transmission characteristics are measured using the pulsed wave, not using the continuous wave as the incident light.

Even in this case, similar to the case of FIG. 3, it may be confirmed that when the incident light is not present, the transmission characteristics of the terahertz wave are not modified at all 40 in all the structures fabricated in various heat treatment conditions. Further, it may be configured that even when the incident light is present, the difference in the transmission characteristics according to other heat treatment conditions and the degree of crystallization is shown similar to the case illustrated in FIG. 3. However, it may be confirmed that the modulation efficiency of the terahertz wave is greatly improved. As compared with the case in which the organic material is not present 41, in case of the non-crystalline α-phase, the transmission of the terahertz wave is blocked by about 25% 42 and it is shown that in case of the crystalline α-phase and the crystalline β-phase, the transmission of the terahertz wave is blocked by 65% 43 and 70% 44 or more. That is, it can be appreciated that when the pulsed wave is used, the modulation efficiency of the terahertz wave is improved by 30% or more in average.

Figure 5:
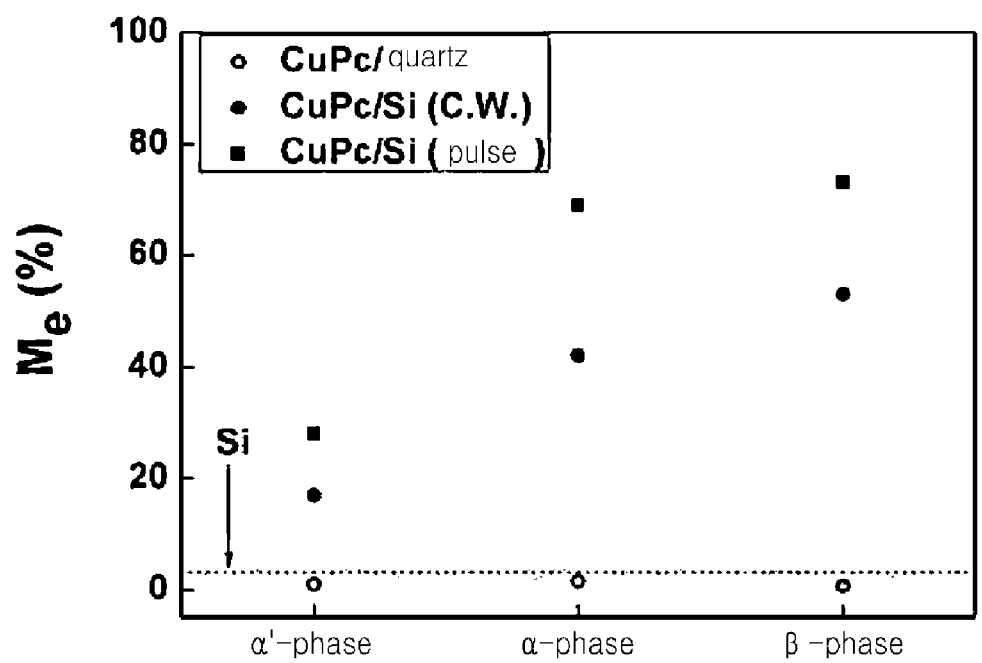
FIG. 5 is a graph illustrating modulation efficiency of a terahertz wave according to the exemplary embodiment of the present invention on the basis of a pick value.

FIG. 5 is a graph illustrating the modulation efficiency of the terahertz wave according to the exemplary embodiment of the present invention on the basis of a pick value. For comparing the modulation efficiency according to the structure, the modulation efficiency at three structures illustrated in FIG. 2 are measured and then shown. The case of the transparent layer 20/semiconductor 22 or transparent layer 20/organic material 21/transparent layer 20 structure shows similar transmission characteristics for the organic materials having various degrees of crystallization fabricated in other fabrication conditions, but it may be clearly appreciated that when the incident light is present in the transparent layer 20/organic material 21/semiconductor 22 structure, the modulation efficiency of the terahertz is maximized, which may show that the optimized structure of the modulator is the transparent layer/organic material/semiconductor according to the one implementation example of the present invention.

Figure 6:
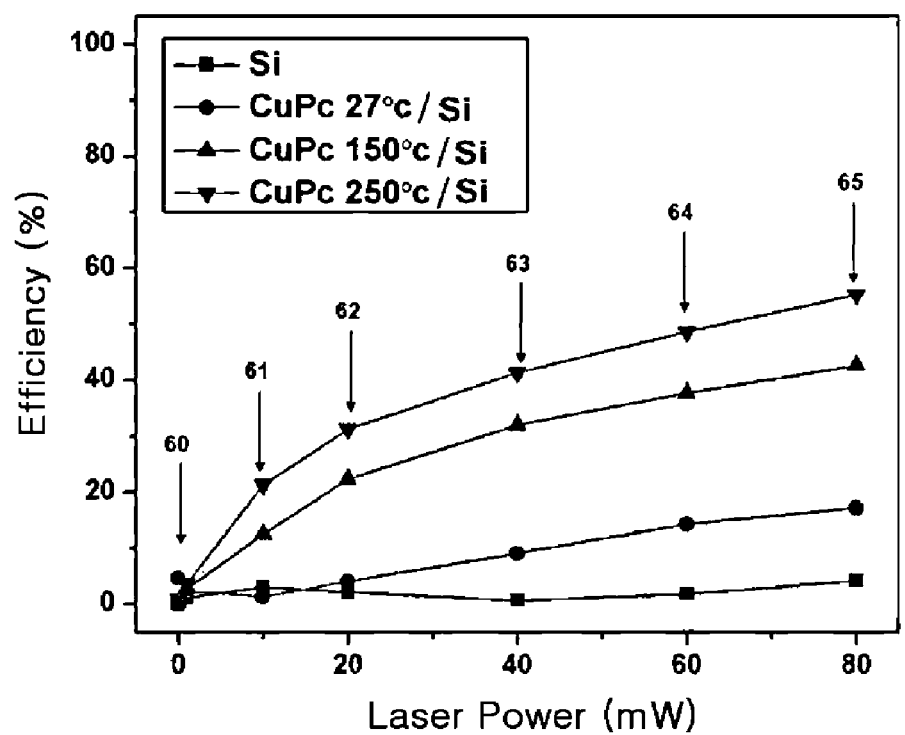
FIG. 6 is a graph illustrating a change in transmission efficiency when laser power is continuously changed.

FIG. 6 is a graph illustrating a change in transmission efficiency when the incident light is used as the continuous wave and the laser power is continuously changed.

It may be confirmed that as the laser power slowly increases from 0, the transmission efficiency continuously increases from 0% (60→61→62→63→64→65). This is shown that the number of free holes excited by the incident light and injected into the organic material increases the laser power.

The characteristics may be used for a device for the terahertz wave having the controllable modulation efficiency capable of controlling the transmission efficiency of the terahertz wave when the laser power is changed.

The present invention may modulate the waveform of the terahertz wave in a time domain 70 based on the experiment results (FIGS. 3 to 6).

Figure 7:
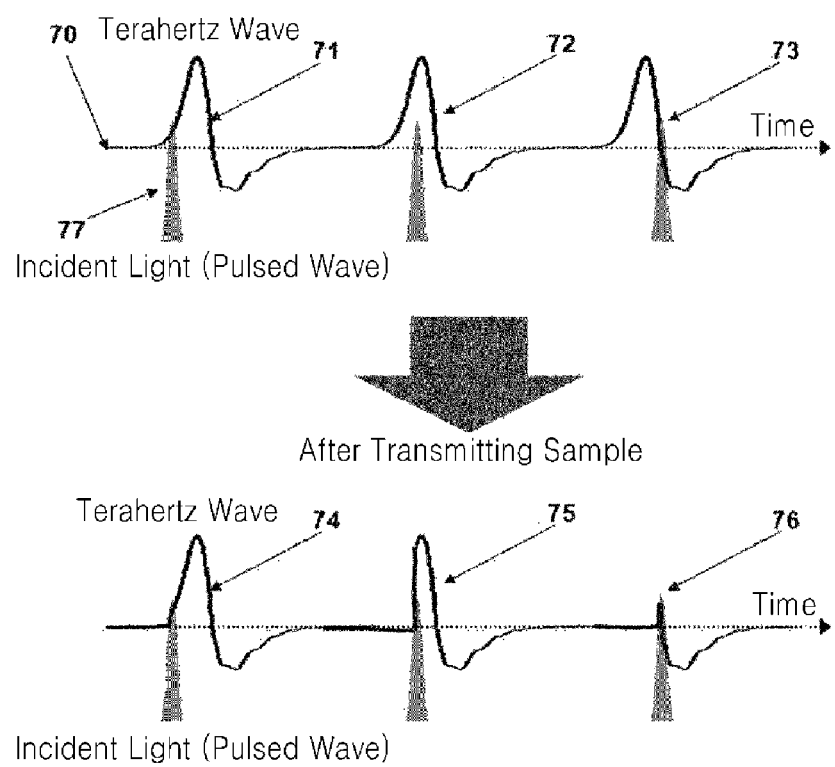
FIG. 7 is a conceptual diagram illustrating a principle of modulating a waveform of a terahertz wave.

FIG. 7 is a conceptual diagram illustrating a principle of modulating a waveform of the terahertz wave. Pulsed terahertz waves 71, 72, and 73 form longer waveforms in a time domain, as compared with incident light 77 in the visible light region. Therefore, each pulse of the incident light may be at different specific positions of the terahertz wave by using a time delay method.

An apparatus capable of transmitting only a part of the waveform of the terahertz wave and selectively blocking 74, 75, and 76 a part thereof in the time domain by using the characteristics of the transmission reduction of the terahertz wave in response to the incident light may be configured. The terahertz wave modulated in the time domain may finally induce the change in width, amplitude, and phase of the transmission wavelength of the spectrum, such that the terahertz wave modulation device having a wide function may be provided.

Further, the highly functional terahertz wave modulation device having various characteristics by being coupled with the characteristics of the designer surface plasmon or the metamaterial on the basis of the experimental results (FIGS. 3 to 6) may be provided.

When the organic material deposited on the semiconductor is structured and then is irradiated with incident light, the characteristics of the designer surface plasmon or the metamaterial may be generated. Accordingly, the device for the terahertz wave may be provided by coupling the generated characteristics with an ultra-speed modulation function of the transparent layer/organic material/semiconductor structure. In this case, in order to apply the characteristics of the designer surface plasmon or the metamaterial, all types of structures, forms, or patterns which are known in the art may be applied.

Figure 8:
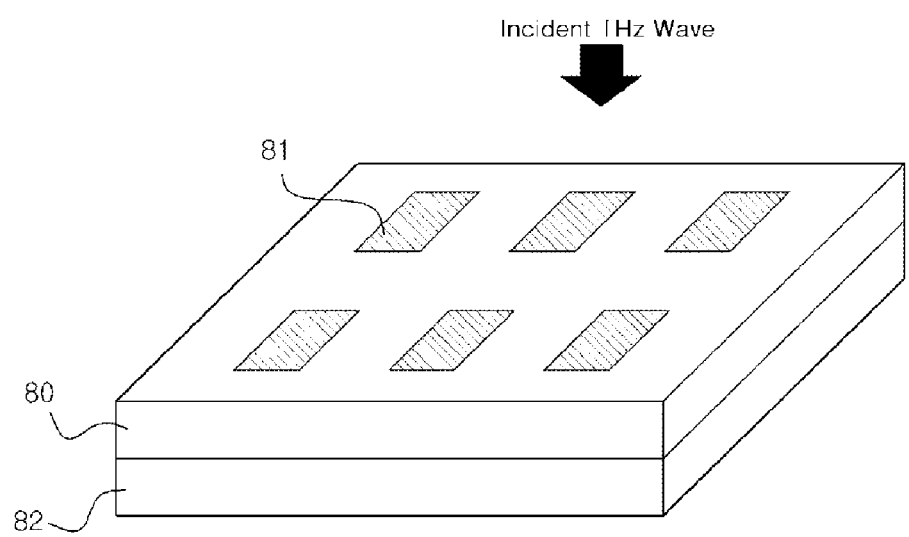
FIG. 8 is a perspective view illustrating one of representative structures used for a study of designer surface plasmon.

FIG. 8 is a perspective view illustrating one of representative structures used for a study of the designer surface plasmon.

When the organic material 80 is disposed on the semiconductor substrate 82 to have a pattern 81 having a specific form and then is irradiated with incident light, the metallic layer is formed by the free electrons/holes excited by the semiconductor substrate and the organic material to show the designer surface plasmon characteristics, which is shown as the transmission resonance phenomenon at the specific wavelength.

The exemplary embodiment of the present invention may control the transmission resonance according to the presence and absence of incident light. The organic material deposited on the semiconductor substrate may be fabricated to have various forms and structures and thus the high-functional terahertz wave modulation device having various functions may be implemented.

While the invention has been shown and described with respect to the particular embodiments, it will be understood by those skilled in the art that various changes and modification may be made without departing from the spirit and scope of the invention as defined in the following claims.

The invention claimed is:

1. A terahertz wave modulator, comprising:
   a semiconductor substrate;
   a terahertz modulation layer including an organic-material layer disposed on the semiconductor substrate; and
   a first incident wave radiation unit configured to radiate a first incident wave including a terahertz wave region to be orthogonally incident on the terahertz modulation layer; and a second incident wave radiation unit configured to radiate a second incident wave, which is pulsed wave or incident light, incident on the terahertz modulation layer at a controlled non-normal angle.

2. The terahertz wave modulator of claim 1, wherein the organic-material layer is made of organic materials selected from the group consisting of copper phthalocyanine, anthrancene, tetracene, pentacene, 3,4,9,10-perylenetetracarboxylic dianhydride (PTCDA), C60, aluminum-tris-quinolate (Alq3), and rubrene.

3. The terahertz wave modulator of claim 1, wherein the organic-material layer includes a β-phase crystalline structure.

4. The terahertz wave modulator of claim 1, wherein the organic-material layer is deposited by a thermal evaporation method and annealed at 100 to 500° C.

5. The terahertz wave modulator of claim 1, wherein the terahertz modulation layer further includes a transparent layer made of materials selected from the group consisting of quartz, sapphire, and PMMA, and the transparent layer is disposed on the organic-material layer.

6. The terahertz wave modulator of claim 1, wherein the second incident wave is the pulsed wave.

7. The terahertz wave modulator of claim 1, wherein the organic-material layer includes a plurality of apertures arranged in a predetermined pattern, and the plurality of the apertures perforate through the organic-material layer.

8. A terahertz wave switching device, comprising:
   a semiconductor substrate;
   a terahertz modulation layer including
      an organic-material layer disposed on the semiconductor substrate, and
      a transparent layer made of materials selected from the group consisting of quartz, sapphire, and PMMA, which is disposed on the organic-material layer;
   a first incident wave radiation unit configured to radiate a first incident wave including a terahertz wave region to be orthogonally incident on the terahertz modulation layer;
   a second incident wave radiation unit configured to radiate a second incident wave, which is pulsed wave or incident light, incident on the terahertz modulation layer at a controlled non-normal angle; and
   a second incident wave radiation control unit configured to determine whether the second incident wave is radiated.

9. The terahertz wave switching device of claim 8, wherein the second incident wave is the pulsed wave.

* * * * *